US012559823B2

(12) United States Patent　　　　　(10) Patent No.:　　US 12,559,823 B2
Aoyama et al.　　　　　　　　　　　(45) Date of Patent:　　　Feb. 24, 2026

(54) TUNGSTEN WIRE, AND TUNGSTEN WIRE PROCESSING METHOD AND ELECTROLYTIC WIRE USING THE SAME

(71) Applicant: Niterra Materials Co., Ltd., Yokohama (JP)

(72) Inventors: Hitoshi Aoyama, Yokohama (JP); Hideaki Baba, Yokohama (JP); Masanori Mizobe, Yokohama (JP); Kenji Tomokiyo, Yokohama (JP)

(73) Assignee: Niterra Materials Co., Ltd., Yokohama (JP)

( * ) Notice: Subject to any disclaimer, the term of this patent is extended or adjusted under 35 U.S.C. 154(b) by 117 days.

(21) Appl. No.: 18/492,929

(22) Filed: Oct. 24, 2023

(65) Prior Publication Data

US 2024/0052461 A1　　Feb. 15, 2024

Related U.S. Application Data

(63) Continuation of application No. PCT/JP2022/013189, filed on Mar. 22, 2022.

(30) Foreign Application Priority Data

Apr. 27, 2021　(JP) ................................. 2021-074583

(51) Int. Cl.
　　*C22C 27/04*　　　(2006.01)
　　*B21C 1/00*　　　　(2006.01)
　　*B22F 5/12*　　　　(2006.01)
　　*B23H 3/00*　　　　(2006.01)
　　*G01R 1/067*　　　(2006.01)

(52) U.S. Cl.
　　CPC ................ *C22C 27/04* (2013.01); *B21C 1/00* (2013.01); *B22F 5/12* (2013.01); *B23H 3/00* (2013.01); *G01R 1/06755* (2013.01)

(58) Field of Classification Search
　　None
　　See application file for complete search history.

(56) References Cited

U.S. PATENT DOCUMENTS

| | | |
|---|---|---|
| 10,760,187 B2 | 9/2020 | Terada et al. |
| 10,967,447 B2 | 4/2021 | Kanazawa et al. |
| 11,090,978 B2 | 8/2021 | Shibata et al. |
| 2011/0319931 A1 | 12/2011 | Esaki |
| 2018/0326518 A1 | 11/2018 | Kanazawa et al. |
| 2018/0326519 A1 | 11/2018 | Kanazawa et al. |

(Continued)

FOREIGN PATENT DOCUMENTS

| | | |
|---|---|---|
| JP | 4-44373 B2 | 7/1992 |
| JP | 5-198351 A | 8/1993 |
| JP | 7-233447 A | 9/1995 |

(Continued)

OTHER PUBLICATIONS

International Search Report issued Apr. 19, 2022 in PCT/JP2022/013189 filed on Mar. 22, 2022, 2 pages.

(Continued)

*Primary Examiner* — Xiaobei Wang
(74) *Attorney, Agent, or Firm* — Oblon, McClelland, Maier & Neustadt, L.L.P.

(57) ABSTRACT

According to one embodiment, a tungsten wire includes a tungsten alloy containing rhenium. The tungsten wire includes a protrusion peak density (Spd) of 7000 or more and 11000 or less as a surface roughness parameter.

12 Claims, 7 Drawing Sheets

(56) References Cited

U.S. PATENT DOCUMENTS

2020/0149137 A1    5/2020   Roth

FOREIGN PATENT DOCUMENTS

| | | | |
|---|---|---|---|
| JP | 2637255 | B2 | 8/1997 |
| JP | 2000-100377 | A | 4/2000 |
| JP | 2001-312952 | A | 11/2001 |
| JP | 3490376 | B2 | 1/2004 |
| JP | 3568543 | B2 | 9/2004 |
| JP | 3769000 | B2 | 4/2006 |
| JP | 3803675 | B2 | 8/2006 |
| JP | 3923966 | B2 | 6/2007 |
| JP | 4256126 | B2 | 4/2009 |
| JP | 4928994 | 82 | 5/2012 |
| JP | 5578852 | B2 | 8/2014 |
| JP | 2015-83955 | | 4/2015 |
| JP | 5879897 | B2 | 3/2016 |
| JP | 6213934 | B1 | 10/2017 |
| JP | 6253313 | B2 | 12/2017 |
| JP | 6273624 | 81 | 2/2018 |
| JP | 6340708 | B2 | 6/2018 |
| JP | 2018-187739 | A | 11/2018 |
| JP | 2018-187741 | A | 11/2018 |
| JP | 2019-131841 | A | 8/2019 |
| JP | 2020-33631 | A | 3/2020 |
| JP | 6736092 | B2 | 8/2020 |
| JP | 2021-30352 | A | 3/2021 |
| WO | WO 2010/100808 | A1 | 9/2010 |
| WO | WO 2021/033500 | A1 | 2/2021 |

OTHER PUBLICATIONS

Office Action issued Sep. 24, 2025 in Japanese Patent Application No. 2024-208850, with concise English translation, citing document 1 therein.

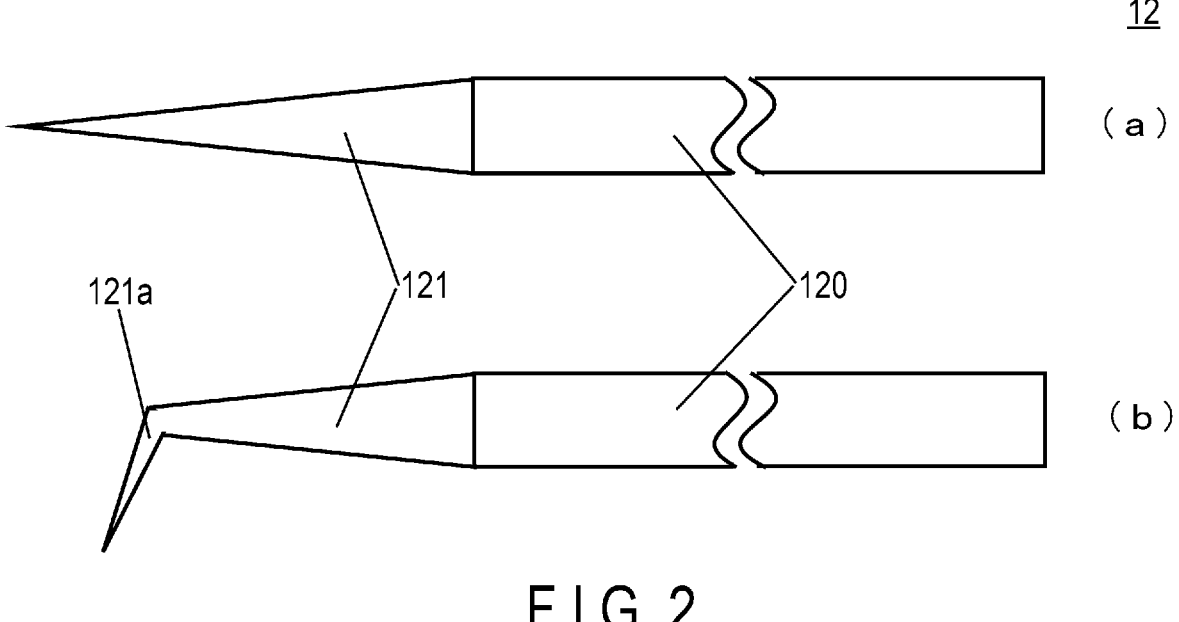
F I G. 2

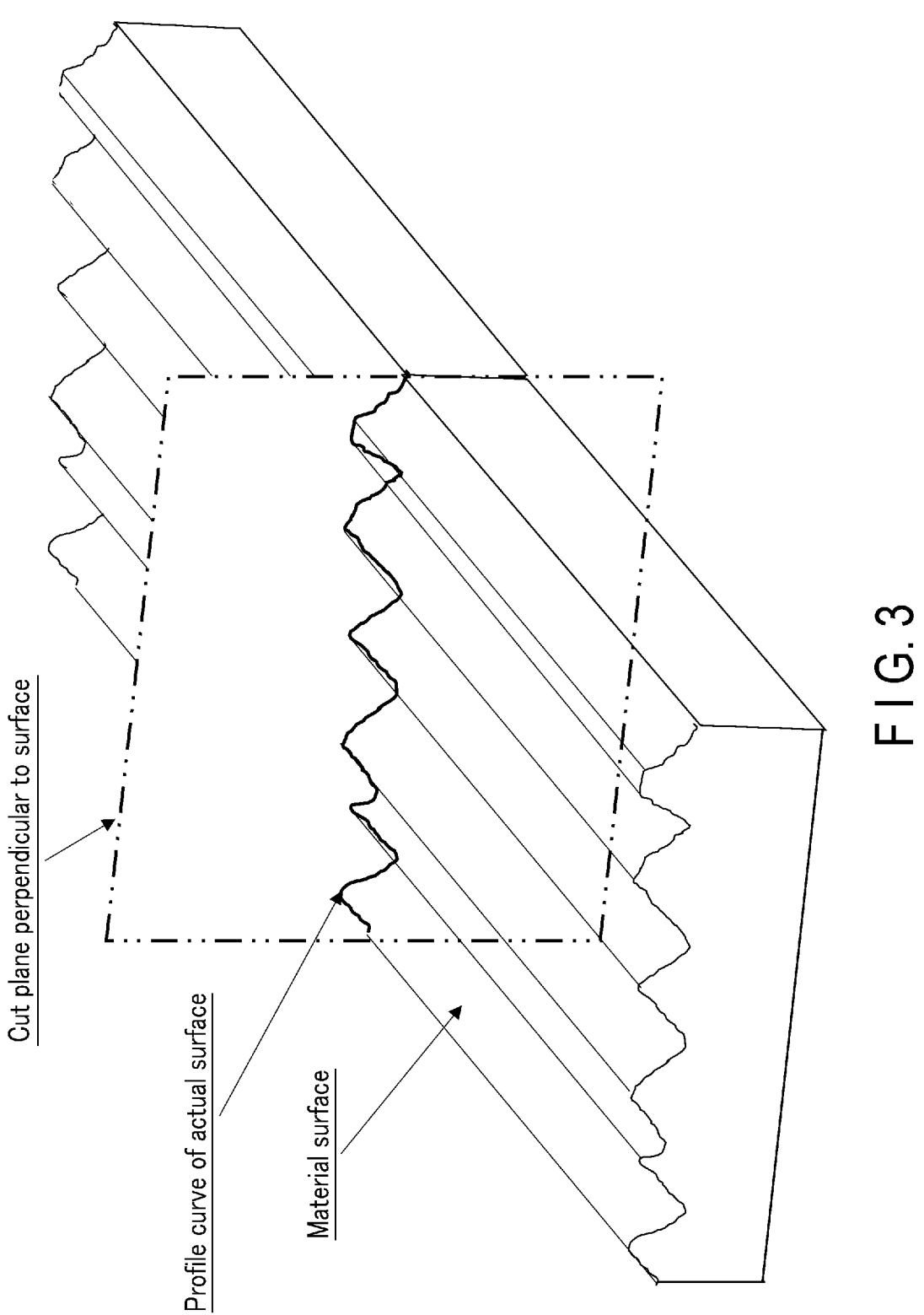
Cut plane perpendicular to surface
Profile curve of actual surface
Material surface
F I G. 3

$$Ra=1/L \times \int_{0}^{L} |Z(x)| dx$$

a) W wire sample
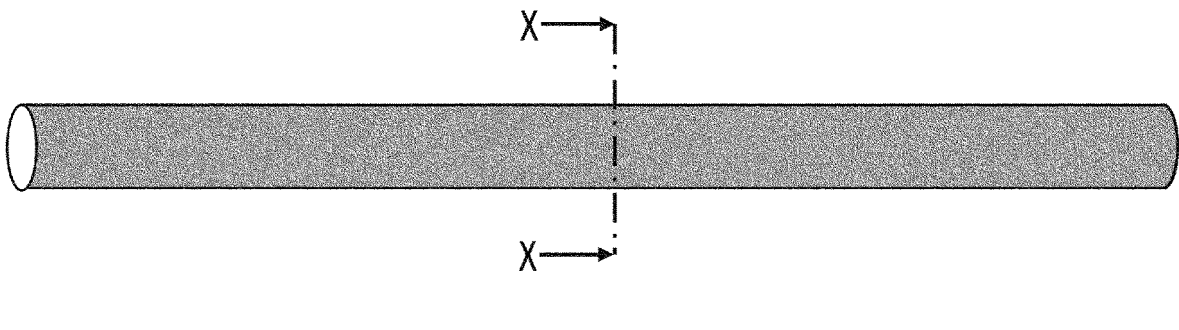
F I G. 5a
b) Sample cross-section (X–X)
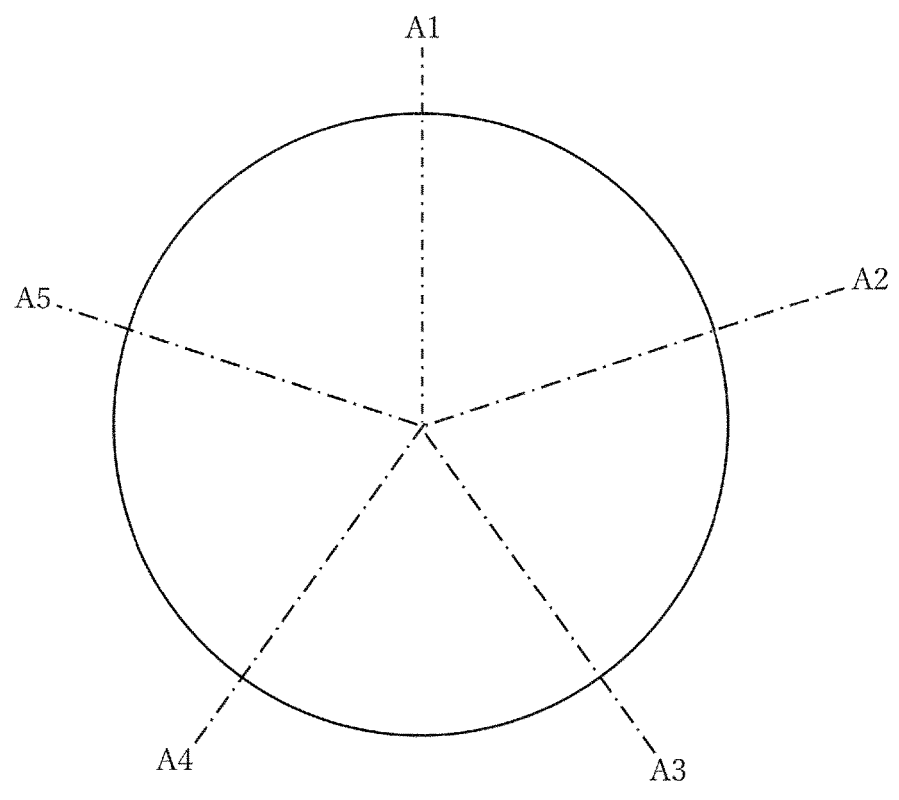
F I G. 5b a) Surface protrusions
$$\text{Spd } (/mm^2) = B(n) / E$$
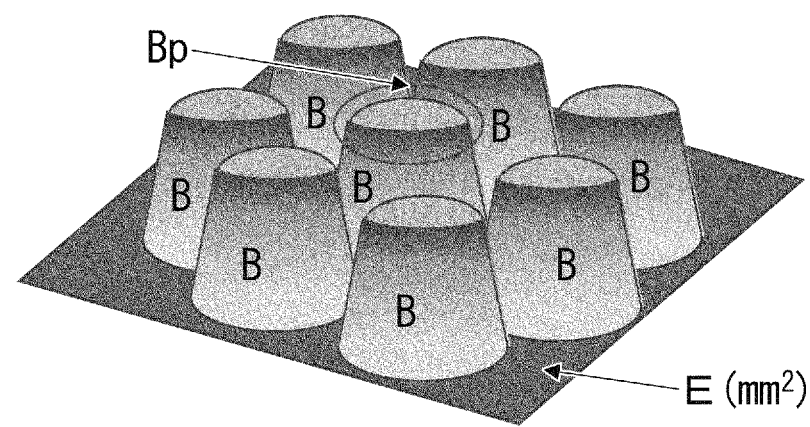
F I G. 6a
b) Calculation example for Spc
$$\text{Spc } (/mm) = 1 / r$$
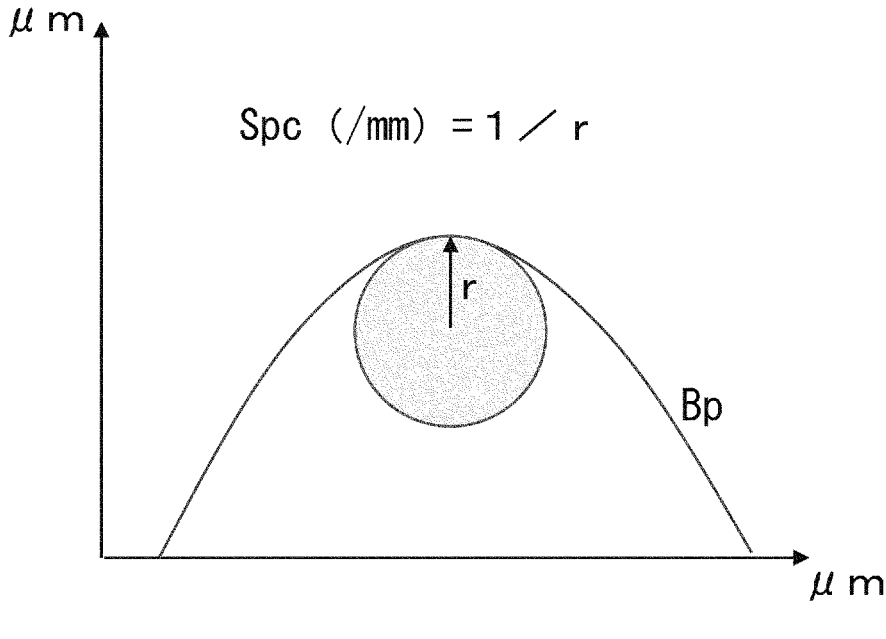
F I G. 6b

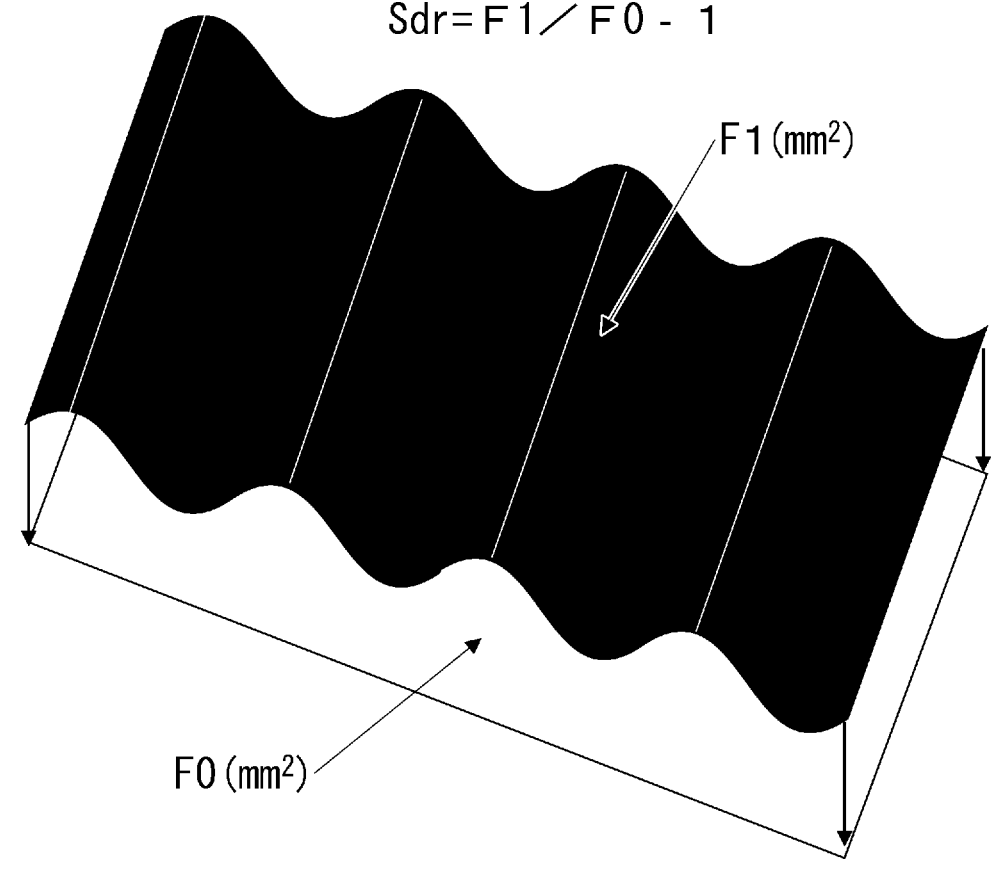
F I G. 7

TUNGSTEN WIRE, AND TUNGSTEN WIRE PROCESSING METHOD AND ELECTROLYTIC WIRE USING THE SAME

CROSS-REFERENCE TO RELATED APPLICATION

This application is a Continuation Application of PCT Application No. PCT/JP2022/013189, filed Mar. 22, 2022 and based upon and claiming the benefit of priority from Japanese Patent Application No. 2021-074583, filed Apr. 27, 2021, the entire contents of all of which are incorporated herein by reference.

FIELD

Embodiments described below relate to a tungsten wire, and a tungsten wire processing method and an electrolytic wire using the tungsten wire.

BACKGROUND

A device called a probe card is used in testing electrical characteristics of an IC chip formed of a semiconductor device. FIG. 1 schematically shows an example of a vertical type probe card 10. Lead lines 11 are connected with probe pins 12. A test unit 13 is lifted up to contact the tips of the probe pins 12 and then further raised by several tens of micrometers (μm) to one hundred and several tens of micrometers (μm) so that the test unit 13 and the tips of the probe pins 12 are pushed against each other (which is called "overdriving") to ensure their complete contact. This causes a warping (elastic deformation) of the probe pins 12.

FIG. 2 shows examples of shapes of the probe pin 12. The probe pin 12, for example, may be of a type <a> which is constituted by a straight portion 120 and a tapered portion 121, or of a type <b> which includes a bent portion 121a formed by bending the tip of the tapered portion 121. In some cases, the straight portion 120 is subjected to processes such as an insulating coating process. The type <a> is used for a vertical type probe card, and the type <b> is used for a cantilever type probe card. As a standard dimension, the pin has a diameter of about Φ 0.05 to 0.20 mm in the straight portion and a total pin length of about 20 to 100 mm. Conventionally adopted general materials for probe pins include tungsten (W), a rhenium-tungsten (ReW) alloy, a palladium (Pd) alloy, beryllium copper (Cu—Be), and so on, which are selectively used according to the types of electrode pads. There are mainly two types of electrode pads, namely, an aluminum pad and a gold pad. For aluminum pads, W or ReW probe pins having a high hardness and superior electric resistance and wear resistance are usually used in view of the need to penetrate through the insulating covering formed by oxidation on the electrode pad surface.

With the development of integration-enhancing and miniaturization-pursuing technologies for semiconductors, narrower pitches and smaller diameters of the pins in probe cards are still being demanded, and at present, ReW pins of even a size of φ 0.02 mm to 0.04 mm are in use. To cope with the testing of LSI of a high degree of integration, a smaller diameter is adopted for probe pins so as to increase the number of pins arranged per unit area. A smaller pin diameter incurs, for example, a situation where pushing forces of respective probe pins attributable to the elastic deformation under the overdriving could be significantly affected by dimensional variations. Also, in order to increase the number of probe pins in the arrangement, the interval between the probe pins needs to be further reduced, which incurs a situation where the number of arranged pins could be significantly affected by the dimensional variations. As such, the demand for dimensional accuracy of the pins is also becoming very large.

Probe pins are obtained by, for example, cutting a small-diameter tungsten wire (thin wire) into pieces of a predetermined length and fixing their diameters through mechanical or chemical surface polishing. At this time, if the material thin wire has a non-constant diameter, a large cutting margin needs to be set. There is also a possibility that a portion that is not sufficient for the cutting margin cannot be formed into a product. Such a decrease in yield becomes more apparent if the diameter of the material wire is small. In the processes to prepare the material thin wire, a sintered object is first subjected to a swaging and drawing (wire drawing) process (first treatment) or the like to form a material wire having a diameter in a range (0.3 to 1.0 mm) that allows for application to various uses and product types upon division of the wire. A proper amount of the material wire is then subjected to additional processes such as drawing and heating as needed so as to obtain an intended tungsten wire.

Methods for suppressing variations in the wire diameter (wire size) during the drawing process of a tungsten wire include a method in which lubricant management and drawing conditions are strictly controlled. For example, according to a method for tungsten wires (cf. Patent Document 1 (Japanese Patent No. 5,578,852)), a lubricant to be applied to the surface of the W wire contains a graphite (C) powder and a thickening agent, and has a specific weight of 1.0 to 1.1 g/cm³ which changes in the course of processing steps in an amount equal to or less than 0.05 g/cm³. The drawing process uses a tungsten wire temperature of 500° C. or higher and 1300° C. or lower, a drawing die temperature of 300° C. or higher and 650° C. or lower, a drawing rate of 10 m/min or faster and 70 m/min or slower, and an area reduction ratio of 5% or more and 15% or less for the final drawing. Also, methods for preventing baking during a drawing process, which causes variations in the wire diameter, include a method in which the surface is roughened as appropriate to improve the lubricating property of a lubricant. For example, according to stainless wire materials (cf. Patent Document 2 (Jpn. Pat. Appln. KOKAI Publication No. H07-233447)), a wire is subjected to a drawing process to be reformed into a true circle, then to a peeling process to remove surface defects, and to a process in which its surface roughness is adjusted using a shot blast device to 0.8 to 2.5 μm in terms of an arithmetic mean roughness (Ra) defined by JISB0601.

BRIEF DESCRIPTION OF THE DRAWINGS

FIG. 2 is a schematic view showing shapes of a probe pin.

FIG. 3 is a conceptual diagram of a measurement for line roughness.

FIG. 5a is a schematic diagram showing an exemplary sample taken from a W wire for wire drawing.

FIG. 5b is a schematic diagram generally showing a cross-section perpendicular to the axis of the W wire for wire drawing.

FIG. 6a is a diagram for illustrating a measurement concept for Spd.

FIG. 6*b* is a diagram for illustrating a measurement concept for Spc.

FIG. 7 is a diagram for illustrating a measurement concept for Sdr.

DETAILED DESCRIPTION

Figure 1:
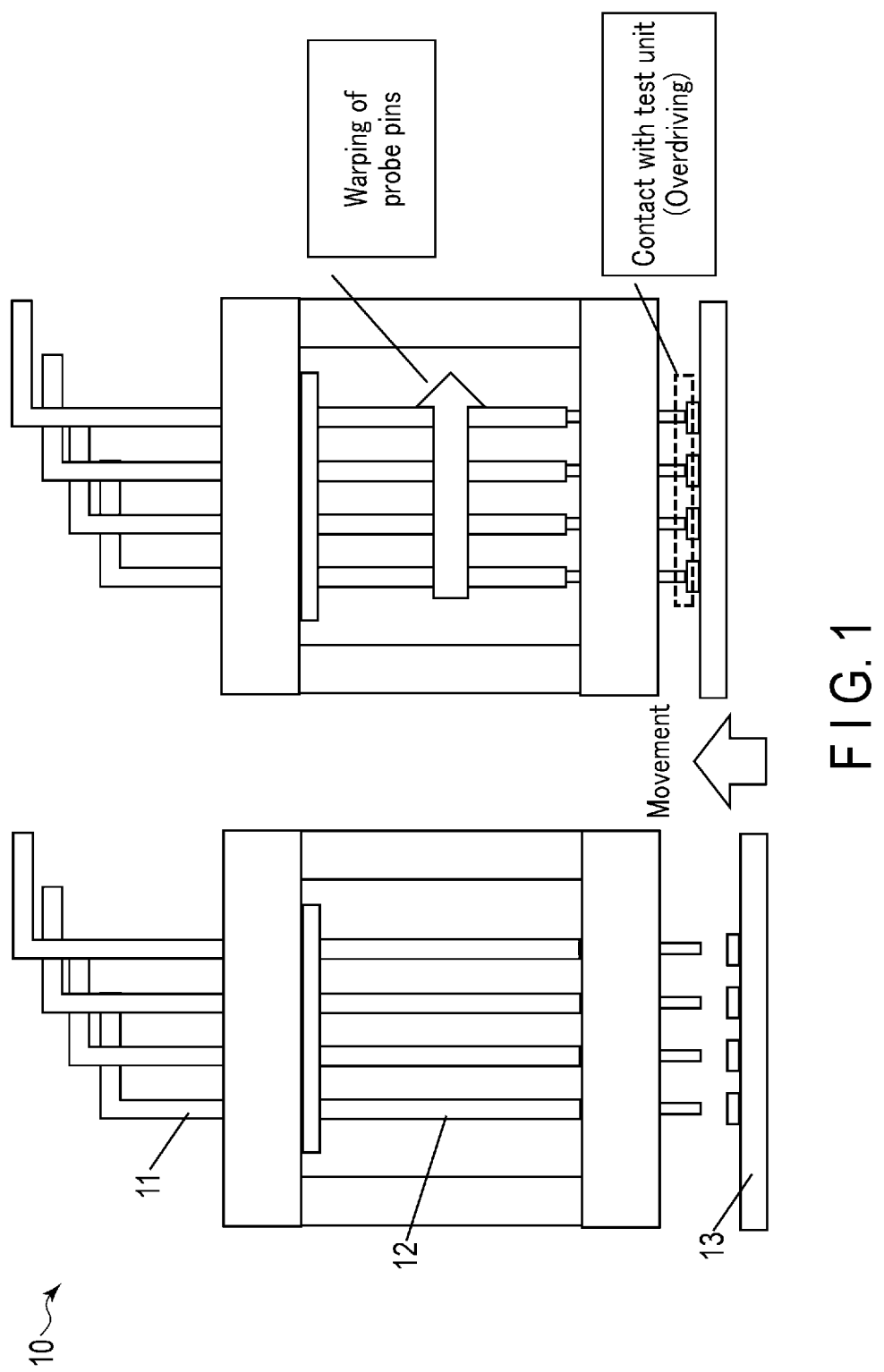
FIG. 1 is a schematic view showing an example of a vertical type probe card.

Patent Document 1 (Japanese Patent No. 5,578,852) points out causes of the variations in the wire diameter after a drawing process, and these causes include a deteriorated lubricating property due to unnecessary heating of the lubricant in each drawing process, an altered deformation resistance due to overheating of the wire, and a lowered processability due to changes in supply of the lubricant (amount of C). It explains that changes in the supplied carbon amount mean changes in the lubricating property, and that the lubricating property is a very important factor for suppressing the variations in the wire diameter. The lubricant is a liquid which is applied (adheres) to the wire surface, is heated, and undergoes the drawing process. There is a concern that if the lubricant does not uniformly adhere to the wire surface, the lubricating property would be changed during the drawing process even under the management using the aforementioned conditions, and a variation in the wire diameter would likely be caused.

Figure 4:
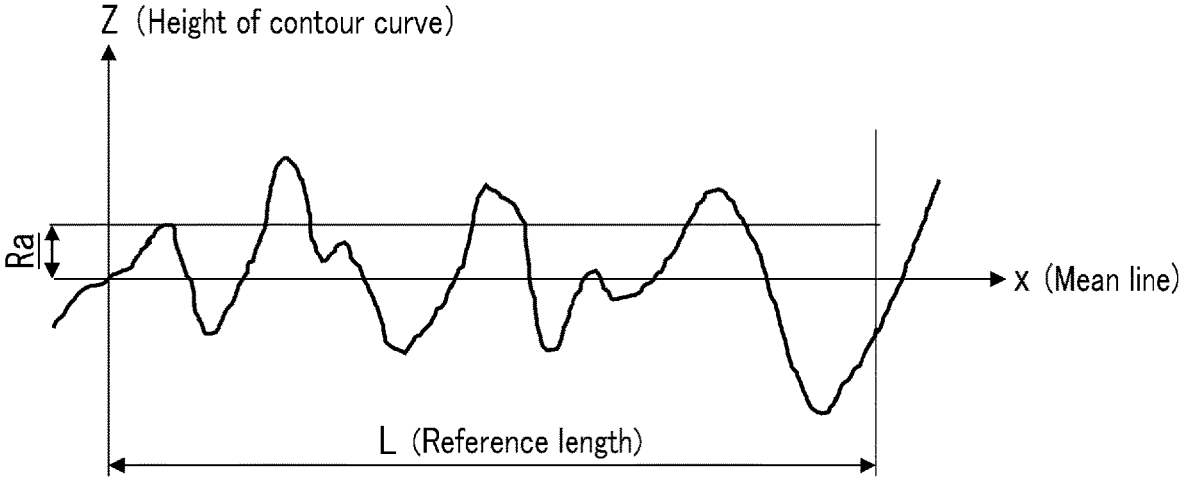
FIG. 4 is a diagram schematically showing an example of an arithmetic mean roughness Ra.

Meanwhile, Patent Document 2 (Jpn. Pat. Appln. KOKAI Publication No. H07-233447) adjusts Ra to improve the adhesion of a lubricant. Here, Ra refers to a parameter for line roughness and is based on measurement of, for example, a profile curve determined by a cut plane perpendicular to the material surface as shown in FIG. 3. Ra is obtained by the equation shown in FIG. 4. Thus, for the sake of evaluation by Ra, it is a prerequisite to uniformly provide an uneven shape over the entire surface, including portions in the circumferential and axial directions. According to Patent Document 2 (Jpn. Pat. Appln. KOKAI Publication No. H07-233447), the surface is cleaned and then mechanically processed by shot blasting so that the surface has a uniform roughness over the entire length. However, processes such as shot blasting are not employed for W wires since W wires are very hard as compared to stainless steel wires, etc., and they do not like embrittlement-inducing impurities remaining on their surfaces, either. As such, it is often the case that tungsten wires, even if they show comparable Ra values, have different uneven shapes and different lubricant adhering characteristics.

Problems to be solved by the present invention include providing a tungsten wire for which variations in the wire diameter have been addressed.

In order to solve the problems, a tungsten wire according to an embodiment includes a rhenium-containing tungsten alloy and has a protrusion peak density (Spd) of 7000 or more and 11000 or less as a surface roughness parameter (cf., ISO 25178-2:2012 and JISB0681).

A tungsten wire for wire drawing according to an embodiment will be described with reference to the figures. Hereinafter, a tungsten wire for wire drawing, a tungsten wire to be subjected to a drawing process, may also be called a "W wire for wire drawing", a "to-be-drawn W wire". The figures are schematic and not intended to limit each component to, for example, a dimensional ratio, etc., illustrated in the figures.

FIG. 5*a* shows an example of a W wire sample taken from a W wire for wire drawing, a to-be-drawn W wire. Preferably, the sample has a length (100 to 150 mm) that permits measurement at multiple points. The W wire for wire drawing, the to-be-drawn W wire, has a mixture layer (oxide layer) on the surface thereof. A main body part which remains after removing this mixture layer with, for example, a sodium hydroxide solution is used as a measurement sample. While any sampling positions may be adopted, it is desirable that sampling be performed at two or more positions in one W wire which are distant from each other, in consideration of the yields of products and in order to confirm variations throughout the entire length of the W wire. The head and tail ends include portions that make the conditions unstable at, for example, the starting and stopping of the wire drawing device, and therefore, such portions are not sampled. The portions involving instability vary their lengths depending on the layout and size of the device.

FIG. 5*b* shows a cross-section (cross-section perpendicular to the axis) taken along the line X-X indicated in FIG. 5*a*. As shown in the figure, straight lines extending from the center and equally dividing the outer periphery into five are assumed, and their respective intersections with the outer periphery are noted as A1 to A5. At these given five point, the shape of the sample surface is measured. The measurement points are for illustrative purposes and the measurement may be conducted at any points; however, these points are preferred for the sake of non-biased measurement over the entire circumference. According to the number (n) of samples observed, "5×n" datasets are acquired. The measurement is conducted in a contactless manner using a laser microscope. A field of view is set to cover the diameter of the sample with an objective lens at a magnification of 10 times (10×), and the entire wire portion within the acquired measurement image is subjected to analysis for a surface roughness parameter according to ISO 25178-2:2012.

With reference to FIG. 6*a*, a description will be given of the measurement concept for a peak density (Spd) of protrusions as a surface roughness parameter. For portions (B) which have been classified as protrusions through morphological imaging, the number of their peaks per unit area ($mm^2$) is calculated. The W wire according to an embodiment has an Spd of 7000 or more and 11000 or less. It is more preferably 8000 or more and 9000 or less. The presence of unevenness over the surface serves to cause the lubricant (C) to uniformly adhere to the surface of the W wire at the time of applying the lubricant and during the heating in a drawing process. It also stabilizes the amount of C drawn into the die together with the W wire during the drawing process. Consequently, it stabilizes the pull-out force in the drawing process and realizes uniform drawing. If Spd is less than 7000, the amount of C drawn into the die during the drawing process becomes unstable, and the lubricating property could be varied. If Spd exceeds 11000, sufficient permeation and adhesion of C to the surface of the W wire, in particular, to the valley parts, becomes difficult, and partial peeling could be induced and the lubricating property could be varied. Such a protrusion density cannot be derived from the line roughness parameter Ra or Rz (maximum height).

With reference to FIG. 7, a description will be given of the measurement concept for a developed interfacial area ratio (Sdr) as a surface roughness parameter. Using a surface area F1 of the curved contour surface in a definition region, and an area F0 conforming to the curved contour surface assumed to be projected onto a plane, an increase ratio is calculated. The W wire according to an embodiment has, for example, an Sdr of 0.16 or less. It is more preferably 0.13 or less. A larger Sdr represents a larger difference in height between the peak parts and the valley parts. If the Sdr exceeds 0.16, the amount of C drawn into the die is largely differentiated between the peak parts and the valley parts, which could result in an unstable lubricating property. Such a height difference for protrusions cannot be derived from the line roughness parameter Ra. Also, Rz is affected by the presence of a flaw or dust on the measurement line, if any. The lower limit is not necessarily set, but in one example, it is 0.06 or more. A smaller Sdr could make the force of the surface of the W wire insufficient for retaining the lubricant at the time of applying the lubricant or at the time of drawing into the drawing die.

With reference to FIG. 6b, a description will be given of the measurement concept for an arithmetic mean curvature (Spc) of peak points as a surface roughness parameter. For the peak part (Bp) of the portion classified as a protrusion as indicated in FIG. 6a, its curvature radius is obtained and a mean value is calculated as shown in FIG. 6b. A larger Spc represents a protrusion having a smaller curvature (being more acute) and having a cross-section similar to a so-called "sawtooth shape", and a smaller Spc represents a protrusion having a larger curvature (being more obtuse) and having a cross-section similar to a so-called "trapezoidal shape". The W wire according to an embodiment has, for example, an Spc of 300 or more and 500 or less. It is more preferably 320 or more and 420 or less. The applied lubricant (C) is uniformly adhered to the surface of the W wire by the anchor effect of the shape of the protrusions. The amount of C drawn into the die together with the W wire is also stabilized during the drawing process. Consequently, the pull-out force in the drawing process is stabilized, and uniform drawing is realized. If the Spc is smaller than 300, the peak part of the protrusion is flat and could become a starting point for the lubricant layer to peel off at the time of drawing into the die. If the Spc exceeds 500, the peak has too small of a width and its strength is reduced, and a risk of deformation due to the force imposed during the drawing process could be incurred, which would cause an overlap (surface defect) on the surface of the W wire.

A root mean square slope (Sdq), which is a surface roughness parameter, is given by Expression 1. The Sdq is an index showing a root mean square of slopes at all points in a definition region, and for example, the Sdq of a plane having an inclination of 45 degrees is "1". As its value increases, the surface becomes steeper. The W wire according to an embodiment has, for example, an Sdq of 0.60 or less. It is more preferably 0.55 or less. If the Sdq is larger than 0.60, an applied lubricant could easily involve non-uniform adhesion. In particular, depending on the number of protrusions, the lubricant may not sufficiently permeate. A steep unevenness could also cause a crack during a drawing process depending on conditions. Such a steepness of the protrusions cannot be derived from the roughness parameter Ra or Rz. The lower limit is not necessarily set, but in one example, it is 0.35 or more. A smaller Sdq could make the force of the surface of the W wire insufficient for retaining the lubricant at the time of applying the lubricant or at the time of drawing into the drawing die.

$$Sdq = \sqrt{\left\{ 1/F0 \times \int\int_{F0} [(\partial z(x, y)/\partial X)^2 + (\partial z(x, y)/\partial y)^2)] dx dy \right\}}$$

The amount of Re contained in the W wire for wire drawing, the to-be-drawn W wire, according to an embodiment is preferably 1 wt % or more and less than 30 wt %, and more preferably 2 wt % or more and 28 wt % or less.

The Re amount refers to a value obtained from analysis according to inductively coupled plasma optical emission spectrometry (ICP-OES). Re promotes elongation of W at a high temperature and thus enhances processability. It also enhances the strength by solid solution strengthening. However, a content of less than 1 wt % does not exert these effects sufficiently. For example, in the case of using it as a material for a probe pin, the obtained probe pin would involve a greater deformation as the frequency of use increases, which can cause a contact failure and consequently a deterioration in testing accuracy for semiconductors. If the Re content is more than about 28 wt %, the solid solubility limit with W is exceeded, and thus, irregular distribution of the σ phase could easily occur. This phase could become a starting point of fracturing during a drawing process, and can greatly lower the yields from the process. With the Re amount of 1 wt % or more and 30 wt % or less, or 2 wt % or more and 28 wt % or less, it is possible to, for example, manufacture electrolyzed wires for probe pins at high yields using the material according to the embodiment, while securing mechanical properties (strength and abrasion resistance).

The W wire for wire drawing, the to-be-drawn W wire, according to an embodiment may contain K as a dopant in an amount of 30 wtppm or more and 90 wtppm or less. The K amount refers to a value obtained from the analysis according to inductively coupled plasma optical emission spectrometry (ICP-OES). The inclusion of K improves the tensile strength and creep strength at high temperature by a doping effect. If the K content is less than 30 wtppm, the doping effect is insufficient. If it exceeds 90 wtppm, the processability could be lowered to significantly decrease the yields. By containing K as a dopant in an amount of 30 wtppm or more and 90 wtppm or less, it is possible to, for example, manufacture thin wires for thermocouples and electronic tube heaters at high yields using the material according to the embodiment, while securing high-temperature characteristics (prevention of a break and deformation during use at high temperature).

Next, a method for manufacturing the W wire for wire drawing according to an embodiment will be described. While the manufacturing method is not particularly limited, methods such as the following may be adopted, for example.

A W powder and a Re powder are mixed so that the Re content accounts for 1 wt % or more and less than 30 wt %. Here, a method of mixing is not particularly limited, but a method of mixing the powders in a slurry form using water or an alcohol solution is particularly preferred since it can provide a powder having a good dispersiveness. The Re powder to be mixed has, for example, an average particle size of less than 8 μm. The W powder is a pure W powder excluding inevitable impurities, or a doped W powder containing K in an amount determined in view of the yields to wire materials. The W powder has, for example, an average particle size of less than 16 μm.

(Expression 1)

As an example, to produce a W—Re mixture powder having an Re content of more than 18 wt %, an ReW-alloy having an Re content of 18 wt % or less is first prepared by a powder metallurgy method, a melting method, or the like, and the alloy is then finely pulverized by a known method. The resultant is mixed with an amount of Re corresponding to a shortage for the desired composition. In the description below, a tungsten wire containing Re may also be called an "ReW wire".

Subsequently, the mixture powder is put into a predetermined mold and press-molded. The pressure employed here is preferably 150 MPa or greater. For the sake of easier handling, the molded object may be subjected to preliminary sintering at 1200 to 1400° C. in a hydrogen furnace in order to facilitate handling. The obtained molded object is sintered in a hydrogen atmosphere or an inert gas atmosphere constituted by argon, etc., or under vacuum. The sintering temperature is preferably 2500° C. or higher. If it is lower than 2500° C., Re atoms and W atoms do not diffuse well during the sintering. The upper limit of the sintering temperature is 3400° C. (or equal to or lower than the melting point of W of 3422° C.). If the upper limit of the sintering temperature exceeds the melting point of W (3422° C.), the molded object cannot maintain its shape and would turn into a defect. The relative density after the sintering is preferably 90% or more. With the sintered object having a relative density of 90% or more, it is possible to reduce the occurrence of cracking, chipping, breaking, etc., in the following swaging steps (SW steps).

Molding and sintering may be simultaneously carried out through hot pressing in a hydrogen atmosphere or an inert gas atmosphere constituted by argon, etc., or under vacuum. The pressure is preferably 100 MPa or greater, and the heating temperature is preferably 1700° C. to 2825° C. This hot pressing method can provide a dense sintered object even at a relatively low temperature.

The sintered object obtained from this sintering step is subjected to a first swaging step (SW step). The first SW step is preferably carried out at a heating temperature of 1300 to 1600° C. It is preferred that one heat treatment (one heating) give a reduction ratio of the cross-sectional area (area reduction ratio) in a range of 5 to 15%.

Instead of the first SW step, a rolling step (RM step) may be conducted. The RM step is preferably carried out at a heating temperature of 1200 to 1600° C. The area reduction ratio with one heating is preferably 40 to 75%. As a rolling mill, a two-way to 4-way roller rolling mill, a die roll rolling mill, or the like may be used. With the RM step, the manufacturing efficiency can be greatly increased. The first SW step and the RM step may be combined.

The sintered object (ReW rod) that has undergone the first SW step or the RM step, or their combination, is subjected to a second SW step. The second SW step is preferably carried out at a heating temperature of 1200 to 1500° C. The area reduction ratio with one heating is preferably 5 to 20%.

The ReW rod after the second SW step is then subjected to a recrystallization treatment. The recrystallization treatment may be conducted with, for example, a high-frequency heater device at a treatment temperature in a range of 1800 to 2600° C. in a hydrogen atmosphere or an inert gas atmosphere constituted by argon, etc., or under vacuum.

The ReW rod after the recrystallization is subjected to a third SW step. The third SW step is preferably carried out at a heating temperature of 1200 to 1500° C. The area reduction ratio with one heating is preferably 10 to 30%. The third SW step is continued until the ReW rod has a drawable diameter (preferably 2 to 4 mm).

For the sake of smooth wire drawing, the ReW rod after the third SW step is subjected to a first drawing process, in which a step of applying a lubricant to the surface, a step of drying the lubricant and heating up to a process-enabling temperature, and a step of performing drawing using a drawing die are repeated until the diameter reaches 0.7 to 1.2 mm. As the lubricant, a C-based lubricant excellent in heat resistance is desirable. It is preferred to adopt a temperature of 800° C. to 1100° C. for processing. The process-enabling temperature varies depending on wire diameters, and it becomes higher as the diameter increases. If the processing temperature is lower than the process-enabling temperature, frequent occurrence of cracks, breaking, etc. is expected. If the processing temperature is higher than the process-enabling temperature, occurrence of a seizure between the ReW wire and a die is expected, or a decrease in the deformation resistance of the ReW wire, which induces an occurrence of a diameter variation (thinning) due to the drawing force after the drawing, is expected. The area reduction ratio is preferably 15 to 35%. If it is less than 15%, a difference in constitution between the inside and outside portions, a residual stress, etc., are created during the processing, which would cause a crack. If it is more than 35%, an excessive drawing force is used, which would greatly vary the diameter after the drawing and cause a break. The drawing rate is determined according to the balance between the capacity of the heater device, the distance from the device to the die, and the area reduction ratio.

The ReW wire that has been drawn to have a diameter of 0.7 to 1.2 mm is subjected to polishing. This cancels out the non-uniform unevenness formed on the surface up to the swaging step, and the influence of a mixture layer added to the surface. In addition, this adjusts the shape of the main body surface of the ReW wire. The polishing is carried out, for example, in the manner of electrochemical polishing (electrolytic polishing) within a sodium hydroxide solution. Here, the current (polarity) for use is a very important factor. Electrolysis using a direct current (DC) has an effect of turning unevenness on the surface into evenness. Also, electrolysis using an alternating current (AC) endows the surface with adequate unevenness through polarity changes based on frequencies. The surface state is adjusted by utilizing the combination of such DC electrolysis and AC electrolysis.

As one example of the combination, the DC electrolysis is performed first to cancel out the influence of the preceding process added to the surface of the ReW wire, and then the AC electrolysis is performed to adjust the surface to the intended state. The sodium hydroxide solution has a concentration of, for example, 3 to 15 wt %. The preferred processing rate is 0.4 to 2.0 m/min. If it is lower than 0.4 m/min, the number of processing steps would greatly increase. If it exceeds 2.0 m/min, the electrolysis amount per unit time needs to be increased, which makes the adjustment of the surface state difficult. The current in each electrolysis is preferably in the range of 20 to 50 A.

The electrolysis combination may be conducted multiple times. As for multiple combinations, a larger number of combinations would require a larger device capacity, a more complicated condition management, and an increased number of steps, and as such, the number of combinations is preferably small, while it is discretionary. A step of forming a very thin oxide layer by, for example, burner heating may be conducted between one electrolysis and another electrolysis. This can enable easy adjustment of the surface shape.

The ReW wire after the polishing is subjected to a heat treatment in a furnace of air atmosphere so as to form a dense and uniform oxide layer in conformity with the surface shape. The heating temperature is preferably 700 to 1100° C. If it is lower than 700° C., oxides would not be formed as intended. If it is higher than 1100° C., the composition of oxides would vary. The preferred processing rate is 5 to 20 m/min. If it is lower than 5 m/min, the number of processing steps would greatly increase. If it exceeds 20 m/min, a heat amount needs to be increased in order to raise the temperature, which would likely form a non-uniform oxide layer. Alternatively, the device needs to be significantly large-scaled.

Subsequently, a second drawing process is conducted. The second drawing process preferably gives an area reduction ratio of 15 to 35%. The heating temperature is preferably 1000° C. or lower. The second drawing process provides a W wire for wire drawing, a to-be-drawn W wire, having a diameter of 0.3 to 1.0 mm. A proper amount of the W wire for wire drawing, the to-be-drawn W wire, is then subjected to processes such as a drawing process and a heat treatment as needed under known conditions, so as to obtain a W wire having an intended diameter and necessary properties (strength, hardness, etc.). The resultant is subjected to electrolytic polishing to obtain an electrolytic wire.

EXAMPLES

Example 1: After the first drawing process was conducted, DC electrolysis and AC electrolysis were repeated in order, and the second drawing process was conducted to obtain an ReW wire having a diameter of 1.0 mm.

Example 2: After the first drawing process was conducted, DC electrolysis, burner heating to provide the surface with a gold color oxide layer, and AC electrolysis were conducted, and the second drawing process was conducted to obtain an ReW wire having a diameter of 1.0 mm.

Examples 3 to 5: After the first drawing process was conducted, one DC electrolysis and one AC electrolysis were conducted, and the second drawing process was conducted to obtain an ReW wire having a diameter of 1.0 mm.

Comparative Examples 1 to 4: After the first drawing process was conducted, only DC electrolysis or only AC electrolysis was conducted, and the second drawing process was conducted to obtain an ReW wire having a diameter of 1.0 mm.

Comparative Examples 5 and 6: An ReW wire having a diameter of 1.0 mm was obtained without conducting electrolysis.

The analysis of Re and K was conducted according to inductively coupled plasma optical emission spectrometry (ICP-OES). Table 1 shows, for each sample, the electrolysis treatment and the Re and K analysis values. Note that the lower detection limit of K is 5 wtppm, and the case where K was not added and the analysis value fell below 5 wtppm is indicated with "–".

In each example, 1 kg of ReW wire was used as a material wire. A sample for the surface roughness measurement was taken from both ends of the material wire and boiled in a 25% sodium hydroxide solution for 5 minutes to remove the oxide layer. The surface shape was measured using a laser microscope VK-X1100 manufactured by Keyence Corporation. The wire after the sampling was drawn to have a diameter of 0.08 mm. The finished ReW wire was evaluated for wire diameter variations with respect to the diameter of 0.08 mm. The wire diameter was measured for the entire length using a laser wire diameter measurement device (laser scan micrometer manufactured by Mitutoyo Corporation) at a measurement interval of 0.01 seconds, a minimum display amount of 0.01 μm, and a wire speed of 100 m/min. After the measurement, yields in the cases of wire diameter variations of 1.0% or less (range: 0.0008 mm) and wire diameter variations of 0.5% or less (range: 0.0004 mm) were calculated as length ratios. The results are shown in Table 1. As can be seen from the table, variations in the wire diameter were greatly suppressed in the ReW wires according to the embodiment, and therefore, the ReW wires according to the embodiment can greatly improve the yields in probe pin processes.

TABLE 1

| Sample | Number of electrolysis treatments | | | Amount of Re (%) | Amount of K (ppm) | Surface roughness | | | | Yield with respect to wire diameter variations | |
|---|---|---|---|---|---|---|---|---|---|---|---|
| | DC | AC | Oxidation | | | Spd | Sdr | Spc | Sdq | ≤0.0008 mm | ≤0.0004 mm |
| Ex. 1 | 2 | 2 | No | 3 | 62 | 8,300 | 0.11 | 400 | 0.50 | 99% | 99% |
| Ex. 2 | 1 | 1 | Yes | 3 | 62 | 8,600 | 0.12 | 420 | 0.52 | 99% | 96% |
| Ex. 3 | 1 | 1 | No | 3 | 62 | 9,800 | 0.14 | 430 | 0.56 | 95% | 85% |
| Ex. 4 | 1 | 1 | No | 3 | — | 7,700 | 0.11 | 370 | 0.50 | 98% | 91% |
| Ex. 5 | 1 | 1 | No | 26 | — | 7,400 | 0.10 | 310 | 0.46 | 95% | 88% |
| Comp. Ex. 1 | 2 | 0 | No | 3 | 62 | 6,000 | 0.06 | 270 | 0.38 | 88% | 72% |
| Comp. Ex. 2 | 1 | 0 | No | 3 | 62 | 6,700 | 0.10 | 290 | 0.50 | 88% | 69% |
| Comp. Ex. 3 | 0 | 2 | No | 3 | 62 | 12,400 | 0.15 | 550 | 0.59 | 84% | 63% |
| Comp. Ex. 4 | 0 | 1 | No | 3 | 62 | 11,200 | 0.17 | 510 | 0.64 | 87% | 55% |
| Comp. Ex. 5 | 0 | 0 | No | 3 | 62 | 6,500 | 0.18 | 280 | 0.66 | 82% | 50% |
| Comp. Ex. 6 | 0 | 0 | No | 26 | — | 6,100 | 0.19 | 260 | 0.68 | 83% | 47% |

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

REFERENCE SIGNS LIST

X-X . . . Cross-section (radial section) perpendicular to the drawing direction of the W wire for wire drawing sample
B . . . Portion classified as a protrusion
B(n) . . . Number of peaks
Bp . . . One of the protrusion peaks
E . . . Area (protrusion area) where the protrusions exist
r . . . Curvature radius of peak Bp
F0 . . . Projection area of F1
F1 . . . Surface area of curved contour surface
What is claimed is:

1. A tungsten wire comprising a tungsten alloy containing rhenium, and the tungsten wire comprising a protrusion peak density (Spd) of 7000 or more and 11000 or less as a surface roughness parameter.

2. The tungsten wire according to claim 1, wherein the Spd is 8000 or more and 9000 or less.

3. The tungsten wire according to claim 1, comprising a developed interfacial area ratio (Sdr) of 0.16 or less as a surface roughness parameter.

4. The tungsten wire according to claim 2, comprising a developed interfacial area ratio (Sdr) of 0.16 or less as a surface roughness parameter.

5. The tungsten wire according to claim 1, comprising an arithmetic mean curvature (Spc) of peak points of 300 or more and 500 or less as a surface roughness parameter.

6. The tungsten wire according to claim 2, comprising an arithmetic mean curvature (Spc) of peak points of 300 or more and 500 or less as a surface roughness parameter.

7. The tungsten wire according to claim 1, comprising a root mean square slope (Sdq) of 0.60 or less as a surface roughness parameter.

8. The tungsten wire according to claim 2, comprising a root mean square slope (Sdq) of 0.60 or less as a surface roughness parameter.

9. The tungsten wire according to claim 1, wherein the rhenium is contained in an amount of 1 wt % or more and less than 30 wt %.

10. The tungsten wire according to claim 1, wherein the rhenium is contained in an amount of 2 wt % or more and 28 wt % or less.

11. The tungsten wire according to claim 1, wherein the tungsten alloy contains potassium (K) in an amount of 30 wtppm or more and 90 wtppm or less.

12. The tungsten wire according to claim 1, having a diameter of 0.3 mm or more and 1.0 mm or less.

* * * * *